United States Patent
Amir Firouzkouhi et al.

(10) Patent No.: US 9,048,802 B2
(45) Date of Patent: Jun. 2, 2015

(54) RADIO FREQUENCY POWER AMPLIFIER WITH LINEARIZING PREDISTORTER

(75) Inventors: Hamid R. Amir Firouzkouhi, Mission Viejo, CA (US); Bipul Agarwal, Irvine, CA (US); Hasan Akyol, Newport Beach, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 464 days.

(21) Appl. No.: 13/397,917

(22) Filed: Feb. 16, 2012

(65) Prior Publication Data

US 2012/0149316 A1 Jun. 14, 2012

Related U.S. Application Data

(63) Continuation of application No. PCT/US2009/054023, filed on Aug. 17, 2009.

(51) Int. Cl.
*H04B 1/04* (2006.01)
*H03F 3/16* (2006.01)
*H03G 3/30* (2006.01)

(52) U.S. Cl.
CPC .................................. *H03G 3/3042* (2013.01)

(58) Field of Classification Search
CPC ............... H01L 2924/13063; H01L 29/94; H03F 3/45179; H03F 2200/387; H03F 2203/45394; H03F 3/193; H03F 3/45076; H03F 1/3211; H03F 2203/45646; H03F 3/082; H03F 1/0211; H03F 1/223; H03F 1/301; H03F 1/3205; H03F 1/3241; H03F 3/16; H03F 3/1935

USPC ...................................................... 455/91–129
See application file for complete search history.

(56) References Cited

U.S. PATENT DOCUMENTS

| | | | |
|---|---|---|---|
| 7,110,718 B1 | 9/2006 | Szczeszynski et al. | |
| 7,200,370 B2 * | 4/2007 | Behzad | 455/127.1 |
| 7,408,408 B2 * | 8/2008 | Kang et al. | 330/149 |

(Continued)

FOREIGN PATENT DOCUMENTS

| CN | 101999207 A | 3/2011 |
|---|---|---|
| JP | 2004248161 A * | 9/2004 |

(Continued)

OTHER PUBLICATIONS

Cheng-Chi Yen et al, "A 0.25-µm 20-dBm 2.4-GHz CMOS Power Amplifier with an Integrated Diode Linearizer," IEEE Microwave and Wireless Components Letters, vol. 13, No. 2, dated Feb. 2003.

(Continued)

*Primary Examiner* — Lana N Le
(74) *Attorney, Agent, or Firm* — Knobbe, Martens, Olson & Bear, LLP

(57) ABSTRACT

A power amplifier circuit includes an amplifier MOSFET and a predistorter MOSFET. The predistorter MOSFET source and drain are connected together, and the predistorter MOSFET is connected between the gate of the amplifier MOSFET and a second bias voltage signal. This biasing of the predistorter MOSFET causes it to provide a nonlinear capacitance at the gate of the amplifier MOSFET. The combined nonlinear capacitances of the amplifier MOSFET and predistorter MOSFET provide predistortion that promotes cancellation of the distortion or nonlinearity contributed by the amplifier MOSFET alone.

19 Claims, 5 Drawing Sheets

(56) References Cited

U.S. PATENT DOCUMENTS

| | | |
|---|---|---|
| 2003/0193371 A1 | 10/2003 | Larson et al. |
| 2004/0000952 A1* | 1/2004 | Lautzenhiser et al. ........ 330/295 |
| 2007/0052479 A1 | 3/2007 | Wang |
| 2007/0182485 A1* | 8/2007 | Ko ................................. 330/149 |
| 2007/0285162 A1 | 12/2007 | Vitzilaios et al. |
| 2008/0030274 A1 | 2/2008 | Busking |
| 2008/0136529 A1 | 6/2008 | Liao et al. |
| 2008/0180175 A1 | 7/2008 | Arai |
| 2008/0211585 A1 | 9/2008 | Karoui et al. |
| 2008/0211858 A1 | 9/2008 | Mackey et al. |
| 2009/0243727 A1 | 10/2009 | Bockelman et al. |
| 2009/0251222 A1* | 10/2009 | Khorram ....................... 330/301 |
| 2010/0156539 A1* | 6/2010 | Ha et al. ........................ 330/285 |
| 2010/0182057 A1* | 7/2010 | Mei ............................... 327/157 |

FOREIGN PATENT DOCUMENTS

| | | |
|---|---|---|
| JP | 2008-283407 A | 11/2008 |
| WO | WO 2009/145957 | 12/2009 |

OTHER PUBLICATIONS

International Search Report re International Application No. PCT/US2009/054023, mailed May 4, 2010, in 3 pages.

International Preliminary Report on Patentability and Written Opinion re International Application No. PCT/US2009/054023, issued Feb. 21, 2012 in 5 pages.

Supplementary European Search Report, re Application No. EP 09 84 8548, dated Nov. 6, 2013, in 9 pages.

* cited by examiner

US 9,048,802 B2

RADIO FREQUENCY POWER AMPLIFIER WITH LINEARIZING PREDISTORTER

CROSS-REFERENCE TO RELATED APPLICATIONS

This application is a continuation of International Application No. PCT/US2009/054023, filed Aug. 17, 2009, the benefit of the filing date of which is hereby claimed and the specification of which is incorporated herein by this reference.

BACKGROUND

Radio frequency (RF) transmitters, such as those included in mobile wireless telephone handsets (also referred to as cellular telephones) and other portable radio transceivers, generally include a power amplifier. The power amplifier is typically the final stage of the transmitter circuitry. In some types of transmitters, achieving linear power amplification is of great importance. However, various factors can hamper linear operation. For example, in a transmitter of the type generally included in some types of mobile wireless telephone handsets, where the power amplifier receives the output of an upconversion mixer, the relatively large signal that such a mixer typically outputs can drive the power amplifier into nonlinear operation. Increasing power amplifier current is one technique for promoting linear operation in such a transmitter, but it does not work well in all instances.

As illustrated in FIGS. 1-2, in a transmitter of the type generally included in some types of mobile wireless telephone handsets, the power amplifier 10 typically comprises several amplifier driver stages or sections 12, 14, 16, etc., at least one of which, such as amplifier driver stage 14, comprises a transconductance ($G_m$) amplifier that outputs a radio frequency (RF) current signal 18 (I_OUT) in response to an RF input voltage signal 20 (V_IN). The gain of power amplifier 10 can be controlled by controlling the bias voltage signal 22 (V_BIAS), which is provided via an RF choke 24. (Although not shown in FIGS. 1-2 for purposes of clarity, circuitry in the mobile wireless telephone handset generates bias voltage signal 22 in response to various operating conditions that require adjusting transmitter output power.) As illustrated in FIG. 2, the transconductance amplifier transistor 26 is typically a metal oxide semiconductor field-effect transistor (MOSFET) arranged in a circuit in a common-source configuration. The RF input voltage signal 20 is coupled to the gate of transistor 26 via a coupling capacitor 28. Current source circuitry that is coupled to transistor 26 is not shown for purposes of clarity but is indicated by the ellipsis (" ... ") symbol. Such a MOSFET, when driven by a relatively large signal, produces a nonlinear current signal 18 as a result of transistor effects such as mobility degradation, velocity saturation, and nonlinearity of the input capacitance. It is known to design transconductance amplifiers to operate at increased current levels in an attempt to meet noise performance requirements and to some extent promote linear operation. However, increasing current alone generally cannot provide sufficient overdrive voltage at the gate-source junction to render a linear output current signal 18. A technique known as degeneration can be combined with the above-described increased current technique to further promote linearity, but degeneration hampers the use of bias voltage signal 22 as an amplifier gain control. Also, increasing current in a mobile wireless telephone handset power amplifier tends to more quickly drain the battery.

It would be desirable to promote transconductance amplifier linearity in a manner that does not consume excessive current, degrade amplifier noise performance, or sacrifice bias voltage gain controllability.

SUMMARY

Embodiments of the invention relate to a power amplifier circuit comprising an amplifier MOSFET and a predistorter MOSFET. The amplifier MOSFET has a gate terminal coupled to a first bias voltage and coupled to an input voltage signal via a linear coupling capacitance. (The term "coupled" as used herein means connected via zero or more intermediate elements.) The amplifier MOSFET source and drain terminals, which provide the amplifier output current signal, are coupled to a reference voltage, such as ground or a supply voltage, and a current source or sink. The predistorter MOSFET is connected between the gate terminal of the amplifier MOSFET and a second bias voltage signal. The source and drain terminals of the predistorter MOSFET are connected together so that it provides a nonlinear capacitance at the gate terminal of the amplifier MOSFET.

The gate-source voltage of the amplifier MOSFET is the input voltage signal capacitively divided between the input linear coupling capacitance and the combined non-linear capacitances of the amplifier MOSFET and predistorter MOSFET. As a result, the gate-source voltage of the amplifier MOSFET is nonlinear or predistorted. This predistortion promotes cancellation of the distortion or nonlinearity contributed by the amplifier MOSFET.

Other systems, methods, features, and advantages of the invention will be or become apparent to one with skill in the art upon examination of the following figures and detailed description.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 3:
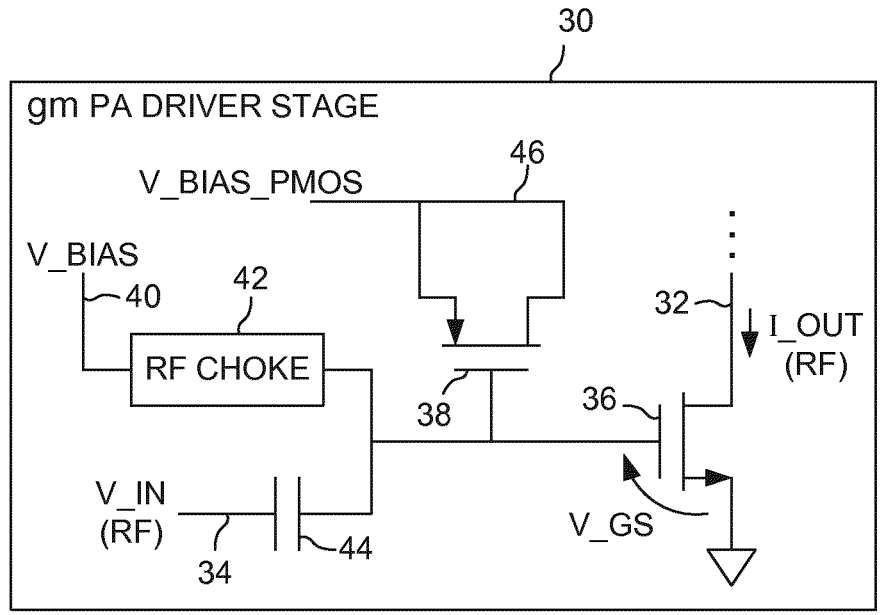
FIG. 3 is a schematic diagram of a portion of a transconductance stage of a power amplifier system in accordance an exemplary embodiment of the present invention.

As illustrated in FIG. 3, an amplifier circuit 30, which can be included in, for example, a transconductance ($g_m$) stage of an RF power amplifier of the type commonly included in some types of mobile wireless telephone handsets, outputs an RF current signal 32 (I_OUT) in response to an RF input voltage signal 34 (V_IN). Amplifier circuit 30 includes an amplifier MOSFET 36 and a predistorter MOSFET 38. In the embodiment shown in FIG. 3, amplifier MOSFET 36 is an n-channel (NMOS) device, and predistorter MOSFET 38 is a p-channel (PMOS) device.

The gate terminal of amplifier MOSFET 36 is coupled to a first bias voltage signal 40 (V_BIAS) via an RF choke 42. The gate terminal of amplifier MOSFET 36 is also coupled to input voltage signal 34 via a linear coupling capacitance 44. The source terminal of amplifier MOSFET 36 is connected to ground. The drain terminal of amplifier MOSFET 36 is connected to current source circuitry, which is not shown for purposes of clarity but is indicated by the ellipsis (" . . . ") symbol.

The source and drain terminals of predistorter MOSFET 38 are connected together, thereby effectively defining a (nonlinear) capacitance. Predistorter MOSFET 38 is connected between the gate terminal of amplifier MOSFET 36 and a second bias voltage signal 46 (V_BIAS_PMOS) such that the gate terminal of predistorter MOSFET 38 is connected to the gate terminal of amplifier MOSFET 36, and the source and drain terminals of predistorter MOSFET 38 are connected to second bias voltage signal 46. This biasing of predistorter MOSFET 38 causes it to provide a nonlinear capacitance at the gate terminal of amplifier MOSFET 36.

Second bias voltage signal 46 and the size of predistorter MOSFET 38 are selected so that the combination of the nonlinear capacitance of predistorter MOSFET 38 and the non-linear capacitance of amplifier MOSFET 36 defines a capacitance that behaves inversely to the manner in which the input capacitance of amplifier MOSFET 36 alone behaves. Note, however, that the nonlinear capacitance of predistorter 38 does not simply cancel out the nonlinear capacitance of amplifier MOSFET 36. Rather, gate-source voltage of amplifier MOSFET 36 is the input voltage signal 34 capacitively divided between linear coupling capacitance 44 and the combined nonlinear capacitances of predistorter MOSFET 38 and amplifier MOSFET 36. As a result, the gate-source voltage of amplifier MOSFET 36 is nonlinear or predistorted. The predistortion cancels out the distortion or nonlinearity of amplifier MOSFET 36. The effect can be better understood with reference to the following equations.

Figure 1:
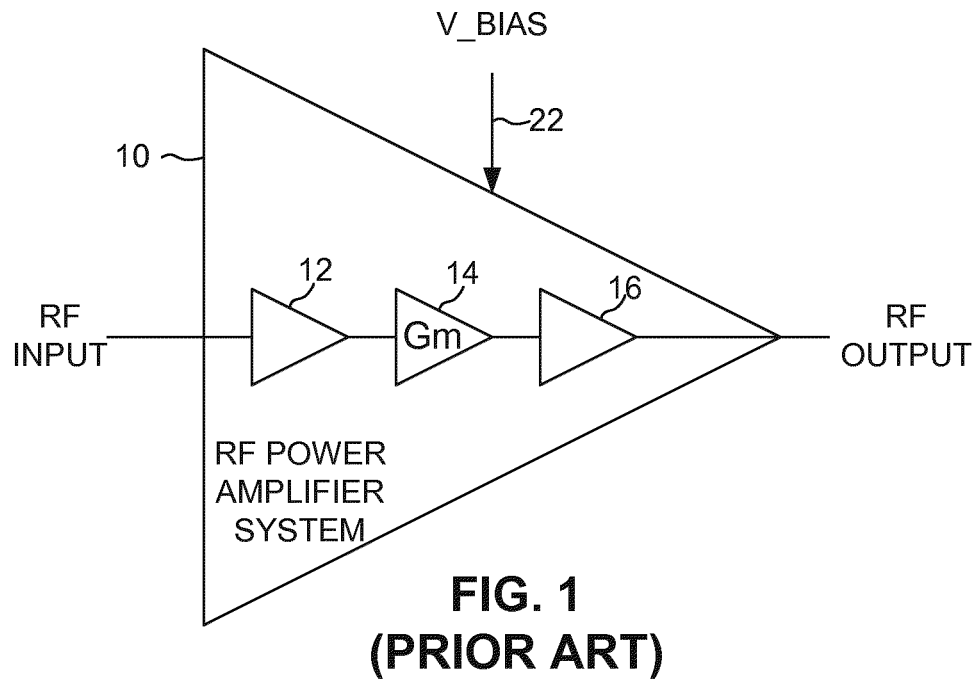
FIG. 1 is a block diagram of a known power amplifier system having at least one transconductance stage.
Figure 2:
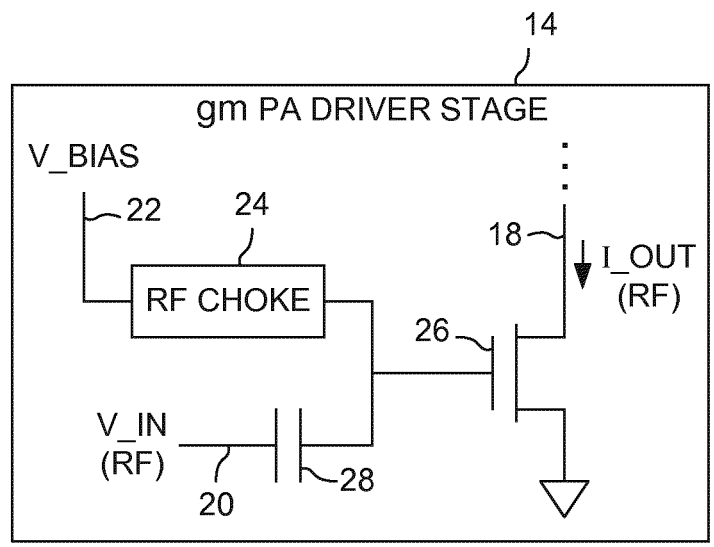
FIG. 2 is a schematic diagram of a portion of a transconductance stage of the power amplifier system of FIG. 1.

In prior transconductance amplifier circuits such as amplifier driver stage 14 shown in FIG. 2:

$$V\_GS_{26} = V\_IN * [C_{28}/(C_{28}+C_{26GG})], \quad (1)$$

where $V\_GS_{26}$ is the gate-source voltage of amplifier MOSFET 26, $C_{28}$ is the capacitance of coupling capacitor 28, and $C_{26GG}$ is the capacitance of amplifier MOSFET 26 at its gate terminal;

$$I\_OUT = Gm_{26}*V\_GS_{26} = Gm_{26}*V\_IN*[C_{28}/(C_{28GG}+C_{26GG})], \quad (2)$$

where $Gm_{26}$ is the transconductance of amplifier MOSFET 26; and $$Gm_{eff} = Gm_{26}*[C_{28GG}/(C_{28GG}+C_{26GG})], \quad (3)$$

where $Gm_{eff}$ is the effective transconductance of amplifier driver stage 14.

From equation (3), it can be seen that the multiplication of a nonlinear transconductance and a nonlinear capacitive division, where the nonlinearities are unrelated to each other, results in a combined nonlinear effective transconductance ($Gm_{eff}$).

In contrast, in the exemplary transconductance amplifier circuit 30 described above with reference to FIG. 3:

$$I\_OUT = Gm_{36}*V\_GS_{36} = Gm_{36}*V\_IN*[C_{44}/(C_{44}+C_{36GG}+C_{38GG})], \quad (4)$$

where $Gm_{36}$ is the transconductance of amplifier MOSFET 36, $V\_GS_{36}$ is the gate-source voltage of amplifier MOSFET 36, $C_{44}$ is the linear capacitance of coupling capacitor 44, $C_{36GG}$ is the nonlinear capacitance of amplifier MOSFET 36 at its gate terminal, and $C_{38GG}$ is the nonlinear capacitance of predistorter MOSFET 38 at its gate terminal; and $$Gm_{eff} = Gm_{36}*[C_{44}/(C_{44}+C_{36GG}+C_{38GG})], \quad (5)$$

where $Gm_{eff}$ is the effective transconductance of amplifier circuit 30.

From equation (5), it can be seen that the multiplication of a nonlinear transconductance and a nonlinear capacitive division, where the nonlinearities are adjusted to cancel each other out, results in a linear effective transconductance ($Gm_{eff}$). The nonlinear capacitance of predistorter MOSFET 38 can be adjusted by selecting the size of predistorter MOSFET 38 and the value of second bias voltage 46. The total nonlinear capacitance of predistorter MOSFET 38 and the total nonlinear capacitance of amplifier MOSFET 36 should be made similar to each other, i.e., having similar nonlinear characteristics. The combination of the size of predistorter MOSFET 38 and the value of second bias voltage 46 that results in the greatest reduction in nonlinear operation of amplifier circuit 30 and results in the total nonlinear capacitance of predistoter MOSFET 38 and the total nonlinear capacitance of amplifier MOSFET 36 being similar to each other can be determined empirically or by any other suitable means. Empirical evaluations can be made through circuit simulations, i.e., modeling the circuit through software means on a suitable workstation computer (not shown), using commonly available simulator software. In a simulation, second bias voltage 46 and the length and width of predistorter MOSFET 38 can be swept through ranges of values with respect to one another, and how linearly or nonlinearly amplifier circuit 30 behaves in response can be observed and the optimal values noted. Through such means, persons skilled in the art to which the invention relates can quickly and easily determine suitable values for one or both of the size of predistorter MOSFET 38 and second bias voltage 46. As an example, amplifier MOSFET 36 could be 4.80 micrometers wide and 0.24 micrometers long; predistorter MOSFET 38 could be 6.72 micrometers wide and 0.24 micrometers long; and second bias voltage 46 could be 650 millivolts. First bias voltage 40 can be, for example, 1.1 volts.

Figure 4:
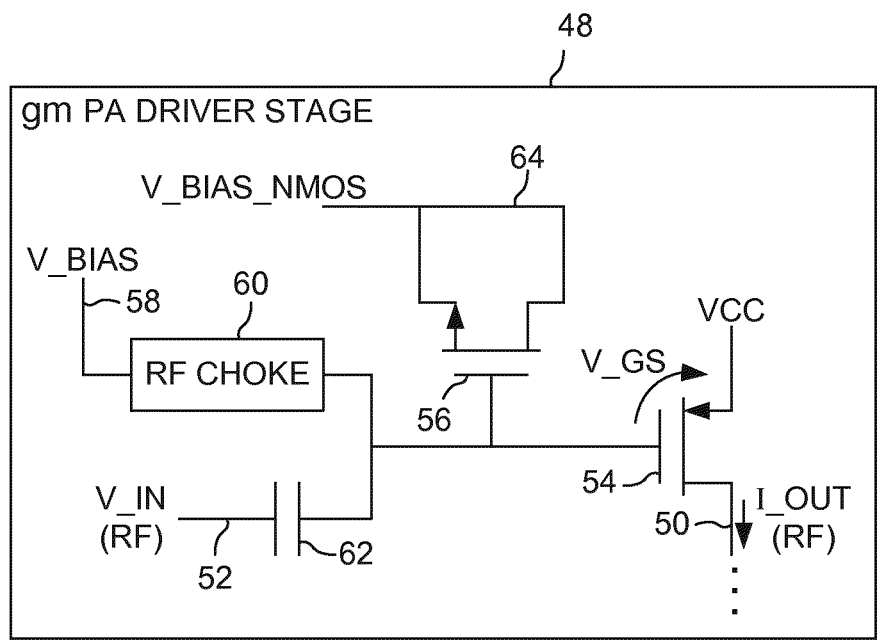
FIG. 4 is a schematic diagram of a portion of a transconductance stage of a power amplifier system in accordance with another exemplary embodiment of the present invention.

An alternative amplifier circuit 48 is illustrated in FIG. 4. Amplifier circuit 48, which can be included in, for example, a transconductance ($g_m$) stage of an RF power amplifier of the type commonly included in some types of mobile wireless telephone handsets, outputs an RF current signal 50 (I_OUT) in response to an RF input voltage signal 52 (V_IN). Amplifier circuit 48 includes an amplifier MOSFET 54 and a predistorter MOSFET 56. In the embodiment shown in FIG. 4, amplifier MOSFET 54 is a p-channel (PMOS) device, and predistorter MOSFET 56 is an n-channel (NMOS) device.

The gate terminal of amplifier MOSFET 54 is coupled to a first bias voltage signal 58 (V_BIAS) via an RF choke 60. The gate terminal of amplifier MOSFET 54 is also coupled to input voltage signal 52 via a linear coupling capacitance 62. The source terminal of amplifier MOSFET 54 is connected to a supply voltage (VCC). The drain terminal of amplifier MOSFET 54 is connected to a current sink circuit, which is not shown for purposes of clarity but is indicated by the ellipsis (" . . . ") symbol.

The source and drain terminals of predistorter MOSFET 56 are connected together, thereby effectively defining a (nonlinear) capacitance. Predistorter MOSFET 56 is connected between the gate terminal of amplifier MOSFET 54 and a second bias voltage signal 64 (V_BIAS_NMOS) such that the gate terminal of predistorter MOSFET 56 is connected to the gate terminal of amplifier MOSFET 54, and the source and drain terminals of predistorter MOSFET 56 are connected to second bias voltage signal 64. This biasing of predistorter MOSFET 56 causes it to provide a nonlinear capacitance at the gate terminal of amplifier MOSFET 54.

Second bias voltage signal 64 and the size of predistorter MOSFET 56 are selected so that the combination of the nonlinear capacitance of predistorter MOSFET 56 and the non-linear capacitance of amplifier MOSFET 54 defines a capacitance that behaves inversely to the manner in which the input capacitance of amplifier MOSFET 54 alone behaves. The predistortion cancels out the distortion or nonlinearity of amplifier MOSFET 54.

Figure 5:
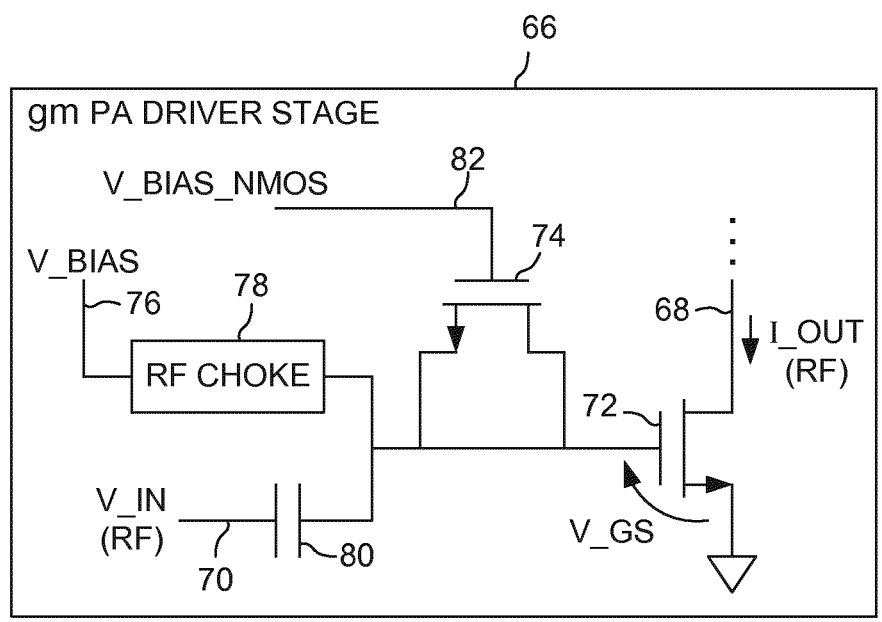
FIG. 5 is a schematic diagram of a portion of a transconductance stage of a power amplifier system in accordance with still another exemplary embodiment of the present invention.

Another alternative amplifier circuit 66 is illustrated in FIG. 5. Amplifier circuit 66, which can be included in, for example, a transconductance ($g_m$) stage of an RF power amplifier of the type commonly included in some mobile wireless telephone handsets, outputs an RF current signal 68 (I_OUT) in response to an RF input voltage signal 70 (V_IN). Amplifier circuit 66 includes an amplifier MOSFET 72 and a predistorter MOSFET 74. In the embodiment shown in FIG. 5, amplifier MOSFET 72 is an n-channel (NMOS) device, and predistorter MOSFET 74 is an n-channel (NMOS) device.

The gate terminal of amplifier MOSFET 72 is coupled to a first bias voltage signal 76 (V_BIAS) via an RF choke 78. The gate terminal of amplifier MOSFET 72 is also coupled to input voltage signal 70 via a linear coupling capacitance 80. The source terminal of amplifier MOSFET 72 is connected to ground. The drain terminal of amplifier MOSFET 72 is connected to a current source circuit, which is not shown for purposes of clarity but is indicated by the ellipsis (" . . . ") symbol.

The source and drain terminals of predistorter MOSFET 74 are connected together, thereby effectively defining a (nonlinear) capacitance. Predistorter MOSFET 74 is connected between the gate terminal of amplifier MOSFET 72 and a second bias voltage signal 82 (V_BIAS_NMOS) such that the gate terminal of predistorter MOSFET 74 is connected to second bias voltage signal 82, and the source and drain terminals of predistorter MOSFET 74 are connected to the gate terminal of amplifier MOSFET 72. This biasing of predistorter MOSFET 74 causes it to provide a nonlinear capacitance at the gate terminal of amplifier MOSFET 72.

Second bias voltage signal 82 and the size of predistorter MOSFET 74 are selected so that the combination of the nonlinear capacitance of predistorter MOSFET 74 and the non-linear capacitance of amplifier MOSFET 72 defines a capacitance that behaves inversely to the manner in which the input capacitance of amplifier MOSFET 72 alone behaves. The predistortion cancels out the distortion or nonlinearity of amplifier MOSFET 72.

The following equations apply to the embodiment shown in FIG. 5:

$$I\_OUT = Gm_{72} * V\_GS_{72} = Gm_{72} * V\_IN * [C_{80}/(C_{80} + \{C_{72GG} + (C_{74DD} + C_{74SS})\})], \quad (6)$$

where $Gm_{36}$ is the transconductance of amplifier MOSFET 36, $V\_GS_{36}$ is the gate-source voltage of amplifier MOSFET 36, $C_{44}$ is the linear capacitance of coupling capacitor 44, $C_{72GG}$ is the nonlinear capacitance of amplifier MOSFET 72 at its gate terminal, $C_{74DD}$ is the nonlinear capacitance of predistorter MOSFET 36 at its drain terminal, and $C_{74SS}$ is the nonlinear capacitance of predistorter MOSFET 38 at its source terminal; and $$Gm_{eff} = Gm_{72} * [C_{80}/(C_{80} + \{C_{72GG} + (C_{74DD} + C_{74SS})\})], \quad (7)$$

where $Gm_{eff}$ is the effective transconductance of amplifier circuit 66.

From equation (7), it can be seen that the multiplication of a nonlinear transconductance and a nonlinear capacitive division, where the nonlinearities are adjusted to cancel each other out, results in a linear effective transconductance ($Gm_{eff}$). The nonlinear capacitance of predistorter MOSFET 74 can be adjusted by selecting the size of predistorter MOSFET 74 and/or the value of second bias voltage 82.

Figure 6:
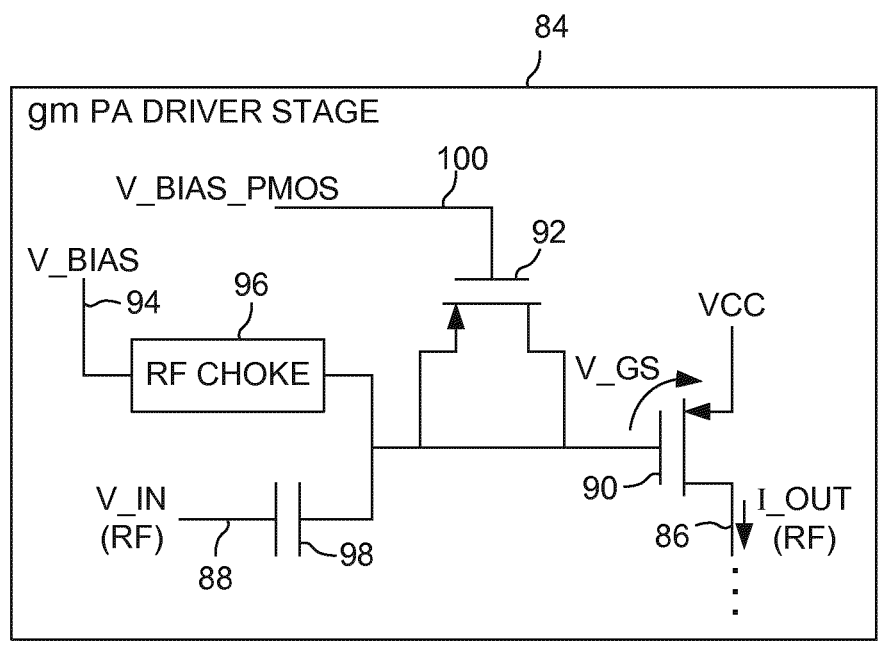
FIG. 6 is a schematic diagram of a portion of a transconductance stage of a power amplifier system in accordance with yet another exemplary embodiment of the present invention.

Still another alternative amplifier circuit 84 is illustrated in FIG. 6. Amplifier circuit 84, which can be included in, for example, a transconductance ($g_m$) stage of an RF power amplifier of the type commonly included in some types of mobile wireless telephone handsets, outputs an RF current signal 86 (I_OUT) in response to an RF input voltage signal 88 (V_IN). Amplifier circuit 84 includes an amplifier MOSFET 90 and a predistorter MOSFET 92. In the embodiment shown in FIG. 6, amplifier MOSFET 90 is an p-channel (PMOS) device, and predistorter MOSFET 92 is an p-channel (PMOS) device.

The gate terminal of amplifier MOSFET 90 is coupled to a first bias voltage signal 94 (V_BIAS) via an RF choke 96. The gate terminal of amplifier MOSFET 90 is also coupled to input voltage signal 88 via a linear coupling capacitance 98. The source terminal of amplifier MOSFET 90 is connected to a supply voltage (VCC). The drain terminal of amplifier MOSFET 90 is connected to a current drain circuit, which is not shown for purposes of clarity but is indicated by the ellipsis (" . . . ") symbol.

The source and drain terminals of predistorter MOSFET 92 are connected together, thereby effectively defining a (nonlinear) capacitance. Predistorter MOSFET 92 is connected between the gate terminal of amplifier MOSFET 90 and a second bias voltage signal 100 (V_BIAS_PMOS) such that the gate terminal of predistorter MOSFET 92 is connected to second bias voltage signal 100, and the source and drain terminals of predistorter MOSFET 92 are connected to the gate terminal of amplifier MOSFET 90. This biasing of predistorter MOSFET 92 causes it to provide a nonlinear capacitance at the gate terminal of amplifier MOSFET 90.

Second bias voltage signal 100 and the size of predistorter MOSFET 92 are selected so that the combination of the nonlinear capacitance of predistorter MOSFET 92 and the non-linear capacitance of amplifier MOSFET 90 defines a capacitance that behaves inversely to the manner in which the input capacitance of amplifier MOSFET 90 alone behaves. The predistortion cancels out the distortion or nonlinearity of amplifier MOSFET 90.

Figure 7:
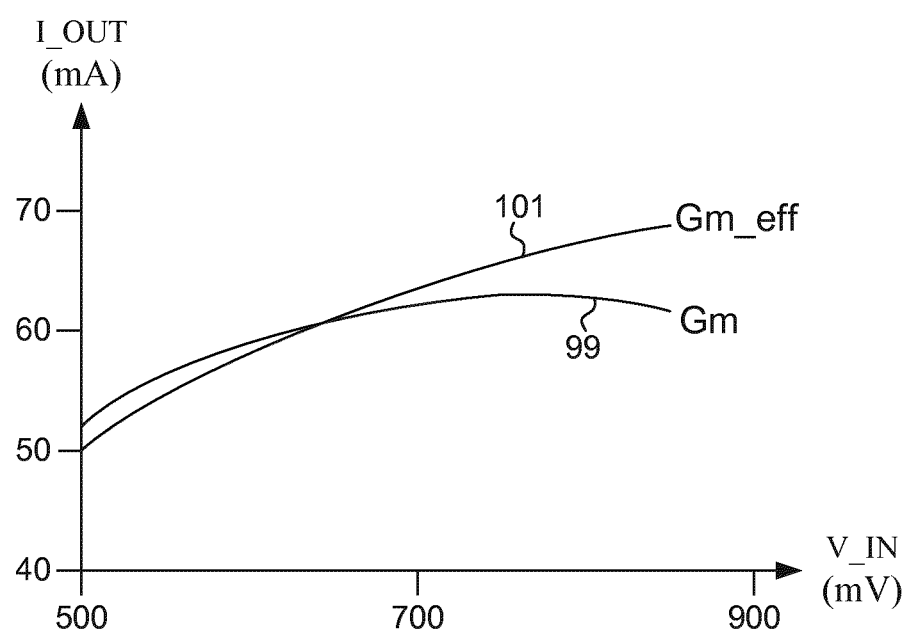
FIG. 7 is a graph showing improvement in transconductance amplifier linearity.

Improved linearity in a transconductance amplifier of the type described above is illustrated in FIG. 7. The transconductance (Gm) 99 that is generally characteristic of a prior amplifier circuit of the type shown in FIG. 2 is nonlinear, whereas the effective transconductance ($Gm_{eff}$) 101 that is generally characteristic of the above-described exemplary RF power amplifier circuits 30, 48, 66 and 84, or other such amplifier circuits to which the invention relates is more linear.

Figure 8:
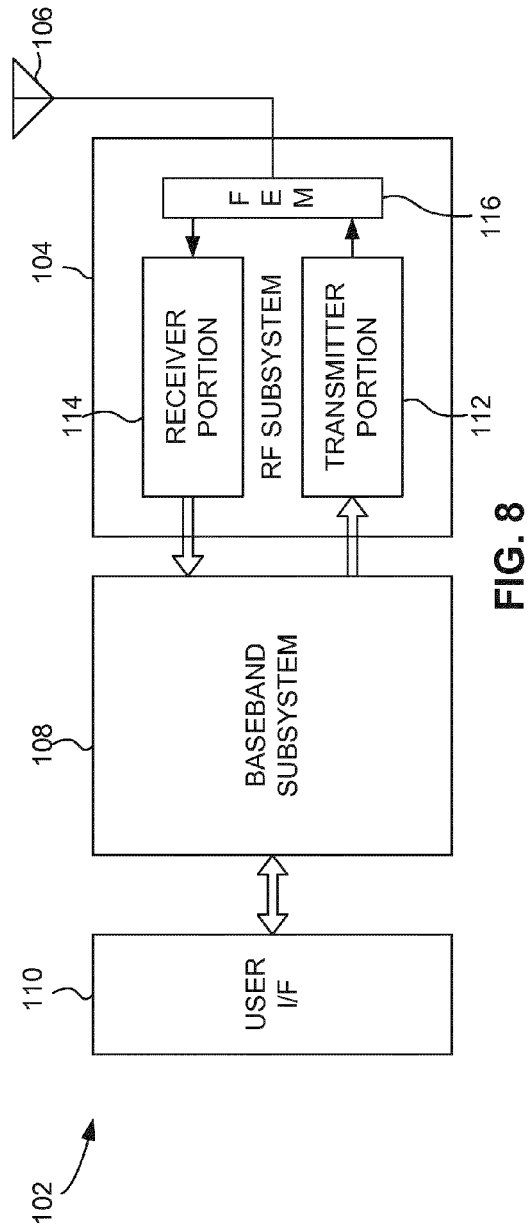
FIG. 8 is a block diagram of a mobile wireless telephone handset having a power amplifier system in accordance with an exemplary embodiment of the present invention.
Figure 9:
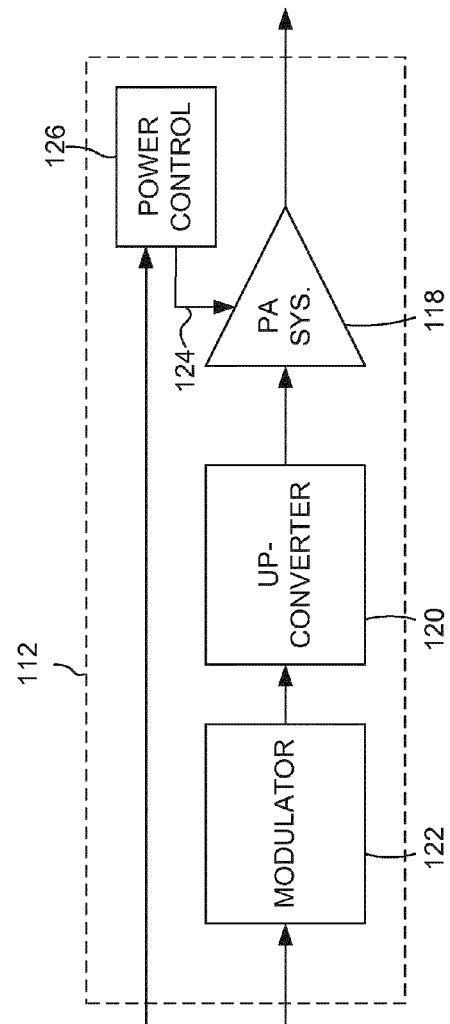
FIG. 9 is a block diagram of the transmitter portion of the mobile wireless telephone handset of FIG. 7.

As illustrated in FIGS. 8 and 9, any of the above-described exemplary RF power amplifier circuits 30, 48, 66 and 84, or other such amplifier circuits to which the invention relates, can be included in a mobile wireless telecommunication device 102, such as a cellular telephone handset. Device 102 includes a radio frequency (RF) subsystem 104, an antenna 106, a baseband subsystem 108, and a user interface section 110. The RF subsystem 104 includes a transmitter portion 112 and a receiver portion 114. The output of transmitter portion 112 and the input of receiver portion 114 are coupled to antenna 106 via a front-end module 116 that allows simultaneous passage of both the transmitted RF signal produced by transmitter portion 112 and the received RF signal that is provided to receiver portion 114. But for portions of transmitter portion 112, the above-listed elements can be of the types conventionally included in such mobile wireless telecommunication devices. As conventional elements, they are well understood by persons of ordinary skill in the art to which the present invention relates and, accordingly, not described in further detail herein. However, unlike conventional transmitter portions of such mobile wireless telecommunication devices, transmitter portion 112 includes a power amplifier system 118 having one or more transconductance stages with the above-described exemplary amplifier circuits 30, 48, 66 and 84 (not shown in FIGS. 7-8) or other such amplifier circuits to which the invention relates. It should be noted that while the invention is described in the context of an exemplary embodiment relating to a mobile wireless telecommunication device, the invention alternatively can be embodied in other devices that include RF transmitters.

As illustrated in FIG. 8, in transmitter portion 112 power amplifier system 118 receives the output of an upconverter 120, which in turn receives the output of a modulator 122. The gain of power amplifier system 118 can be controlled by adjusting one or more power control signals 124. Power control circuitry 126 can generate power control signals 124 in a conventional manner in response to various operating conditions, as well understood in the art. Bias voltage generator circuitry (not shown for purposes of clarity) in power amplifier system 118 can produce the above-described first and second bias voltage signals in response to power control signals 124. As described above, the gain of any of exemplary amplifier circuits 30, 48, 66 and 84 can be controlled by adjusting its first bias voltage signal. Although in this exemplary embodiment the first and second bias control signals are generated by circuitry within power amplifier system 118, in other embodiments any other circuitry within transmitter portion 112 or any other suitable portion of mobile wireless telecommunication device 102 can generate the first and second bias voltage signals.

While various embodiments of the invention have been described, it will be apparent to those of ordinary skill in the art that many more embodiments and implementations are possible that are within the scope of this invention. Accordingly, the invention is not to be restricted except in light of the following claims.

What is claimed is:

1. A power amplifier circuit for a radio frequency (RF) transmitter, the power amplifier circuit comprising:
    an amplifier metal oxide semiconductor field-effect transistor (MOSFET) having a gate terminal coupled to a first bias voltage and an input voltage signal, a source terminal, and a drain terminal, one of the source terminal and the drain terminal coupled to a reference voltage, and the other of the source terminal and the drain terminal configured to provide an output current to a current circuit in response to the input voltage signal;
    a linear capacitance configured to couple the input voltage signal to the gate terminal of the amplifier MOSFET; and
    a predistorter MOSFET connected between the gate terminal of the amplifier MOSFET and a second bias voltage signal, a source terminal of the predistorter MOSFET connected to a drain terminal of the predistorter MOSFET, the amplifier MOSFET, the linear capacitance and the predistorter MOSFET arranged such that a gate-source voltage of the amplifier MOSFET corresponds to the input voltage signal capacitively divided between the linear capacitance and combined nonlinear capacitances of the predistorter MOSFET and the amplifier MOSFET.

2. The power amplifier circuit of claim 1 wherein the amplifier MOSFET includes an n-channel (NMOS) device, the source terminal of the amplifier MOSFET is coupled to a ground reference voltage, the drain terminal of the amplifier MOSFET is coupled to the current circuit, the predistorter MOSFET includes a p-channel (PMOS) device, the source terminal and the drain terminal of the predistorter MOSFET are connected to the second bias voltage signal, and the gate terminal of the predistorter MOSFET is connected to the gate terminal of the amplifier MOSFET.

3. The power amplifier circuit of claim 1 wherein the amplifier MOSFET includes a p-channel (PMOS) device, the source terminal of the amplifier MOSFET is coupled to a supply reference voltage, the drain terminal of the amplifier MOSFET is coupled to the current circuit, the predistorter MOSFET includes an N-channel (NMOS) device, the source terminal and the drain terminal of the predistorter MOSFET are connected to the second bias voltage signal, and the gate terminal of the predistorter MOSFET is connected to the gate terminal of the amplifier MOSFET.

4. The power amplifier circuit of claim 1 wherein the amplifier MOSFET has a nonlinear capacitance substantially equal to a nonlinear capacitance of the predistorter MOSFET.

5. The power amplifier circuit of claim 4 wherein the predistorter MOSFET has a nonlinear capacitance similar to a nonlinear capacitance of the amplifier MOSFET.

6. The power amplifier circuit of claim 5 wherein a combination of predistorter MOSFET size and second bias voltage signal value defines a nonlinear capacitance behaving inversely to an input capacitance of the amplifier MOSFET.

7. The power amplifier circuit of claim 1 wherein the power amplifier circuit is included in a mobile wireless telecommunication device.

8. The power amplifier circuit of claim 7 wherein the wireless telecommunication device is a cellular telephone device.

9. The power amplifier circuit of claim 1 wherein a voltage between a gate terminal of the predistorter MOSFET and the source terminal of the predistorter MOSFET is predistorted by combining a nonlinear capacitance of the predistorter MOSFET with a nonlinear capacitance of the amplifier MOSFET.

10. The power amplifier circuit of claim 1 wherein the gate terminal of the amplifier MOSFET is coupled to the first bias voltage via an RF choke.

11. The power amplifier circuit of claim 1 wherein the reference voltage is ground.

12. The power amplifier circuit of claim 1 wherein the connection of the source terminal of the predistorter MOS- FET to the drain terminal of the predistorter MOSFET defines a nonlinear capacitance of the predistorter MOSFET.

13. The power amplifier circuit of claim 1 wherein the source terminal of the amplifier MOSFET is connected to the reference voltage, the drain terminal of the amplifier MOSFET is connected to the current circuit, and the gate-source voltage of the amplifier MOSFET is predistorted.

14. The power amplifier circuit of claim 1 wherein the power amplifier circuit is included in a transconductance stage of a RF power amplifier.

15. The power amplifier circuit of claim 1 wherein the amplifier MOSFET and the predistorter MOSFET are of the same conductivity type.

16. A power amplifier circuit for a radio frequency (RF) transmitter, the power amplifier circuit comprising:
   an amplifier metal oxide semiconductor field-effect transistor (MOSFET) having a gate terminal coupled to a first bias voltage and coupled, via a linear capacitance, to an input voltage signal, a source terminal, and a drain terminal, one of the source terminal and the drain terminal coupled to a reference voltage, and the other of the source terminal and the drain terminal coupled configured to provide an output current to a current circuit in response to the input voltage signal; and
   a predistorter MOSFET connected between the gate terminal of the amplifier MOSFET and a second bias voltage signal, a source terminal of the predistorter MOSFET connected to a drain terminal of the predistorter MOSFET, the source terminal of the predistorter MOSFET and the drain terminal of the predistorter MOSFET being connected to the gate terminal of the amplifier MOSFET, and the gate terminal of the predistorter MOSFET being connected to the second bias voltage signal.

17. The power amplifier circuit of claim 16 wherein the amplifier MOSFET includes a p-channel (PMOS) device, the source terminal of the amplifier MOSFET is coupled to a supply reference voltage, the drain terminal of the amplifier MOSFET is coupled to the current circuit, and the predistorter MOSFET includes an P-channel (PMOS) device.

18. The power amplifier circuit of claim 16 wherein the amplifier MOSFET includes an n-channel (NMOS) device, the source terminal of the amplifier MOSFET is coupled to a ground reference voltage, the drain terminal of the amplifier MOSFET is coupled to a current source circuit, and the predistorter MOSFET includes an n-channel (NMOS) device.

19. The power amplifier circuit of claim 16 wherein the gate terminal of the amplifier MOSFET is coupled to the first bias voltage via an RF choke.

\* \* \* \* \*